(12) United States Patent
Ishii et al.

(10) Patent No.: US 9,570,486 B2
(45) Date of Patent: Feb. 14, 2017

(54) SOLID-STATE IMAGING DEVICE AND SWITCHING CIRCUIT

(71) Applicant: PANASONIC CORPORATION, Osaka (JP)

(72) Inventors: Motonori Ishii, Osaka (JP); Shigetaka Kasuga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 323 days.

(21) Appl. No.: 14/161,166

(22) Filed: Jan. 22, 2014

(65) Prior Publication Data
US 2014/0131554 A1    May 15, 2014

Related U.S. Application Data

(63) Continuation of application No. PCT/JP2012/004526, filed on Jul. 12, 2012.

(30) Foreign Application Priority Data

Aug. 4, 2011    (JP) .................................. 2011-171388

(51) Int. Cl.
H01L 27/00    (2006.01)
H01L 27/146    (2006.01)
H04N 5/363    (2011.01)

(52) U.S. Cl.
CPC ... *H01L 27/14601* (2013.01); *H01L 27/14665* (2013.01); *H01L 27/14692* (2013.01); *H04N 5/363* (2013.01)

(58) Field of Classification Search
CPC ............... H01L 27/14601; H01L 27/14665; H01L 27/14692; H04N 5/363
(Continued)

(56) References Cited

U.S. PATENT DOCUMENTS 4,363,963 A    12/1982   Ando
6,356,148 B1*   3/2002   Marble ................... G11C 7/06
                                                  327/124
(Continued)

FOREIGN PATENT DOCUMENTS

CN    101815179 A    8/2010
JP    55-120182 A    9/1980
(Continued)

OTHER PUBLICATIONS

International Search Report issued in International Application No. PCT/JP2012/004526 mailed Aug. 14, 2012, 8 pgs.
(Continued)

*Primary Examiner* — Georgia Y Epps
*Assistant Examiner* — Kevin Wyatt
(74) *Attorney, Agent, or Firm* — McDermott Will Emery LLP

(57) ABSTRACT

A solid-state imaging device includes: a photoelectric conversion unit which converts light into signal charges; an accumulation unit which accumulates the signal charges; a transfer transistor connected between the photoelectric conversion unit and the accumulation unit for transferring to the accumulation unit, the signal charges obtained through the conversion by the photoelectric conversion unit; an amplification transistor for amplifying the signal charges accumulated in the accumulation unit to generate a voltage signal, the amplification transistor having a gate connected to the accumulation unit; a reset transistor for resetting a voltage of the accumulation unit; a first amplification circuit for negatively feeding back the voltage signal generated by the amplification transistor to the reset transistor; and a second amplification circuit for positively feeding back the voltage signal generated by the amplification transistor to the amplification transistor.

10 Claims, 9 Drawing Sheets

(58) Field of Classification Search
USPC ....................................................... 250/208.1
See application file for complete search history.

(56) References Cited

U.S. PATENT DOCUMENTS

| | | | |
|---|---|---|---|
| 6,469,740 | B1 | 10/2002 | Kuroda et al. |
| 6,777,660 | B1 | 8/2004 | Lee |
| 2005/0040320 | A1 | 2/2005 | Lule et al. |
| 2007/0090273 | A1* | 4/2007 | Hynecek .................. H03F 1/38 |
| | | | 250/208.1 |
| 2012/0200752 | A1 | 8/2012 | Matsunaga |

FOREIGN PATENT DOCUMENTS

| | | | | |
|---|---|---|---|---|
| JP | 10-281870 A | 10/1998 | | |
| JP | 2004-023380 A | 1/2004 | | |
| JP | 2004-266597 A | 9/2004 | | |
| JP | 2005-244355 A | 9/2005 | | |
| WO | WO 2006124346 A1 * | 11/2006 | ....... | H01L 27/14643 |
| WO | 2011/058684 A1 | 5/2011 | | |

OTHER PUBLICATIONS

Search Report issued in corresponding Chinese Patent Application No. 201280036570.5, mailed on Jul. 18, 2016; with English translation.

\* cited by examiner

SOLID-STATE IMAGING DEVICE AND SWITCHING CIRCUIT

CROSS REFERENCE TO RELATED APPLICATION(S)

This is a continuation application of PCT International Application No. PCT/JP2012/004526 filed on Jul. 12, 2012, designating the United States of America, which is based on and claims priority of Japanese Patent Application No. 2011-171388 filed on Aug. 4, 2011. The entire disclosures of the above-identified applications, including the specifications, drawings and claims are incorporated herein by reference in their entirety.

FIELD

The present disclosure relates to a solid-state imaging device and a switching circuit.

BACKGROUND

A general solid-state imaging device includes an embedded photodiode as a photoelectric conversion unit.

Moreover, Patent Literature 1 (PTL 1) discloses a stacked solid-state imaging device. In this stacked solid-state imaging device, a photoelectric conversion film is formed on a control electrode and, a transparent electrode layer is formed on the photoelectric conversion film. The stacked solid-state imaging device can convert light information into an electric signal at an excellent signal-to-noise (SN) ratio by giving effects obtained from a voltage applied to this transparent electrode to the control electrode via the photoelectric conversion film.

In the stacked solid-state imaging device, a photoelectric conversion film is formed above a semiconductor substrate on which a pixel circuit is formed, via an insulating film. Thus, a material having a large optical absorption coefficient such as amorphous silicon can be used for the photoelectric conversion film. For instance, when the amorphous silicon is used for the photoelectric conversion film, most of green light having a wavelength of 550 nm can be absorbed by a photoelectric conversion film having a thickness of around 0.4 nm.

Moreover, the stacked solid-state imaging device does not include an embedded photodiode. This allows to increase the capacity of the photoelectric conversion unit in the stacked solid-state imaging device. Therefore, saturated charges can be increased. Furthermore, since charges are not completely transferred in the stacked solid-state imaging device, it is possible to facilitate the addition of capacitance. This can achieve sufficient capacitance also in a miniaturized pixel of the stacked solid-state imaging device. Furthermore, a configuration as the stack cell in a dynamic random access memory can be employed in the stacked solid-state imaging device.

CITATION LIST

Patent Literature

[PTL 1] Japanese Unexamined Patent Application Publication No. 55-120182

SUMMARY

Technical Problem

However, in the solid-state imaging device disclosed in PTL 1, a noise is generated when signal charges are reset. That is, a problem in the solid-state imaging device disclosed in PTL 1 is in that capacitive coupling, for example, between a reset signal line and a pixel electrode causes a random noise (reset noise) due to the trailing edge (last transition) in a reset pulse included in a reset signal. In the stacked solid-state imaging device, charges cannot be completely transferred. Therefore, if a correlated double sampling (CDS) circuit samples as performed by a general embedded-photodiode solid-state imaging device, a reset noise (kTC noise) is not completely cancelled. This adds a next signal charge to the reset charges in a state in which a noise is generated. Therefore, signal charges on which a reset noise is superimposed are read. Thus, a problem in the solid-state imaging device disclosed in PTL 1 is in that a random noise increases.

One non-limiting and exemplary embodiment provides a solid-state imaging device in which reduction in a kTC noise is achieved.

Solution to Problem

In one general aspect, the techniques disclosed here feature a solid-state imaging device according to an aspect of the present disclosure includes: a photoelectric conversion unit which converts light into signal charges; an accumulation unit which accumulates the signal charges; a transfer transistor connected between the photoelectric conversion unit and the accumulation unit for transferring to the accumulation unit, the signal charges obtained through the conversion by the photoelectric conversion unit; an amplification transistor for amplifying the signal charges accumulated in the accumulation unit to generate a voltage signal, the amplification transistor having a gate connected to the accumulation unit; a reset transistor for resetting a voltage of the accumulation unit; a first amplification circuit for negatively feeding back the voltage signal generated by the amplification transistor to the reset transistor; and a second amplification circuit for positively feeding back the voltage signal generated by the amplification transistor to the amplification transistor.

According to this configuration, in a solid-state imaging device according to an embodiment of the present disclosure, it is possible to suppress not only a kTC noise generated in the reset transistor, but also a kTC noise generated in the transfer transistor.

Moreover, a first step and a second step may be performed. In the first step, the reset transistor is turned off while negatively feeding back the voltage signal to the reset transistor, by causing the first amplification circuit to operate after the transfer transistor and the reset transistor are turned on. In the second step, the transfer transistor is turned off while positively feeding back the voltage signal to the gate of the amplification transistor, by causing the second amplification circuit to operate after the reset transistor is turned off and the transfer transistor is turned on.

Moreover, the solid-state imaging device may further include a capacitative element connected between the gate of the amplification transistor and an output terminal of the second amplification circuit, in which the second amplification circuit may positively feed back the voltage signal to the gate of the amplification transistor via the capacitative element.

Moreover, a product of a capacitance value of the capacitative element and a gain of the second amplification circuit may be substantially equal to a capacitance value of the accumulation unit.

Moreover, the solid-state imaging device may further include a power source line for supplying a voltage to one of a source and a drain of the amplification transistor, in which the second amplification circuit may positively feed back the voltage signal to the one of the source and the drain of the amplification transistor via the power source line.

Moreover, a product of a capacitance value of the power source line and a gain of the second amplification circuit may be substantially equal to a capacitance value of the accumulation unit.

Moreover, the solid-state imaging device may further include a capacitative element connected between a first terminal and an output terminal of the second amplification circuit, the first terminal being connected to the photoelectric conversion unit and being a source or a drain of the transfer transistor, in which the second amplification circuit may positively feed back the voltage signal to the gate of the amplification transistor via the capacitative element and the transfer transistor.

Moreover, a product of a capacitance value of the capacitative element and a gain of the second amplification circuit may be substantially equal to a capacitance value of the accumulation unit.

Moreover, the solid-state imaging device may include: a plurality of pixels; and a plurality of pixel common circuits each provided for a different set of two or more pixels of the plurality of pixels, in which the plurality of pixels may each include the photoelectric conversion unit and the transfer transistor connected to the photoelectric conversion unit, and the plurality of pixel common circuits may each include the accumulation unit, the amplification transistor, and the reset transistor which are connected to two or more of the transfer transistors belonging to corresponding two or more pixels.

Moreover, a switching circuit according to an aspect of the present disclosure include: first capacitor and second capacitor; a transfer transistor connected between the first capacitor and the second capacitor; an amplification transistor for amplifying charges accumulated in the second capacitor to generate a voltage signal, the amplification transistor having a gate connected to the second capacitor; a third capacitor connected to the gate of the amplification transistor; and an amplification circuit for positively feeding back the voltage signal generated by the amplification transistor to the gate of the amplification transistor via the third capacitor.

It should be noted that the present disclosure can be achieved not only as such a solid-state imaging device, but also as a method of controlling the solid-state imaging device, which includes a step performed based on a characteristic means of the solid-state imaging device.

Furthermore, the present disclosure can be achieved as a semiconductor integrated circuit (LSI) which achieves part or all of the functions of the solid-state imaging device or as an imaging device including the solid-state imaging device.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

Thus, the present disclosure can provide a solid-state imaging device in which reduction in a kTC noise is achieved.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT(S)

Figure 1:
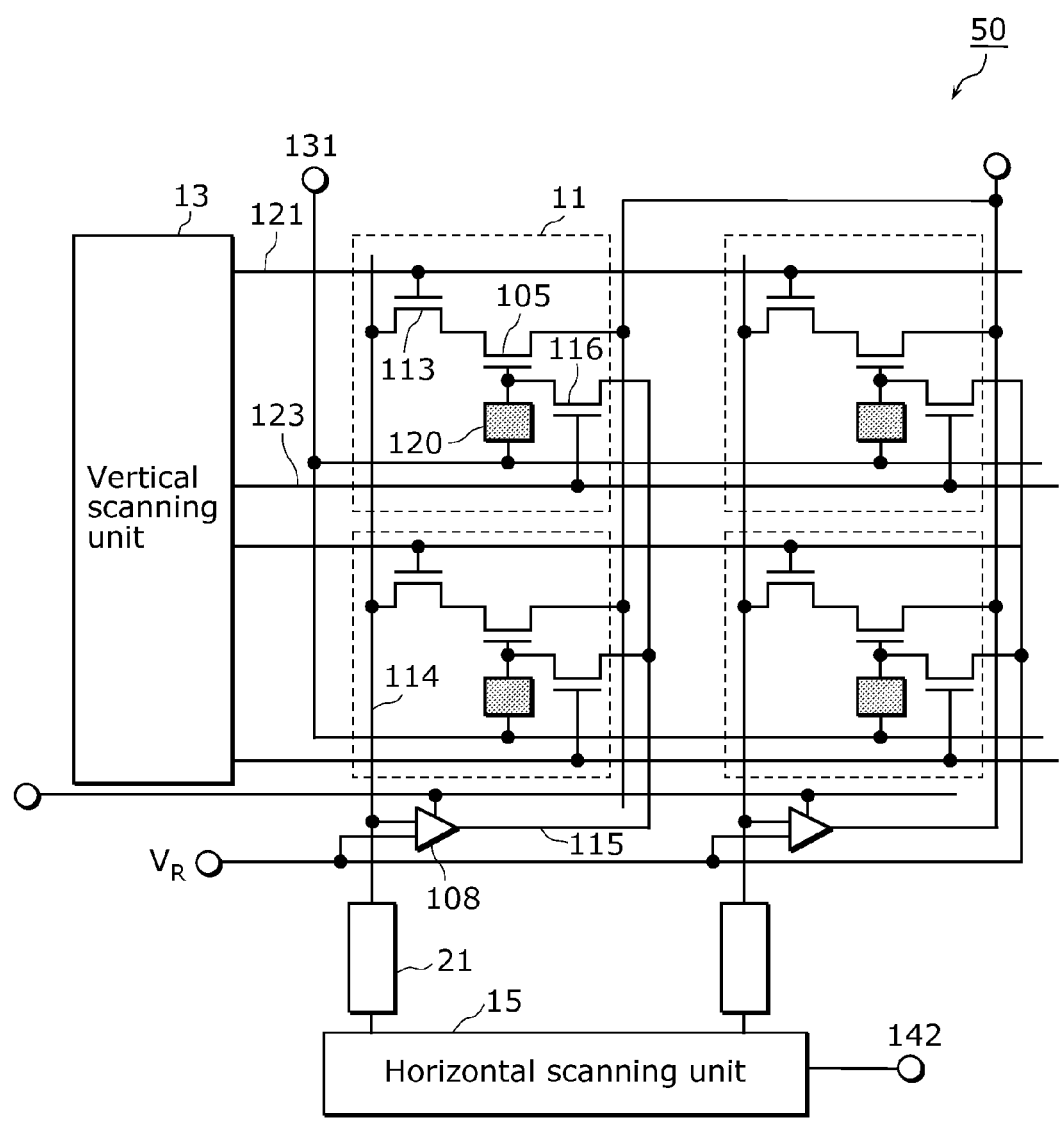
FIG. 1 illustrates a configuration of a solid-state imaging device according to Comparison Example 1.

The following describes the embodiments of the present disclosure with reference to the drawings. In the drawings, the same reference signs represent the same structural elements.

It should be noted that each of the embodiments described below describes a preferable specific example of the present invention. The numerical values, shapes, materials, structural elements, the arrangement and connection of the structural elements, steps, the processing order of the steps and so on shown in the following embodiments are mere examples, and are not intended to limit the present disclosure. The present disclosure is limited only by Claims. Therefore, among the structural elements in the following embodiments, structural elements not recited in any one of the independent claims representing superordinate concept are not essential for achieving the problem of the present disclosure, but are used to achieve a more preferable embodiments.

Comparison Example 1

Before explaining the embodiments of the present disclosure, a solid-state imaging device according to a comparison example of the present disclosure will be described.

Figure 2:
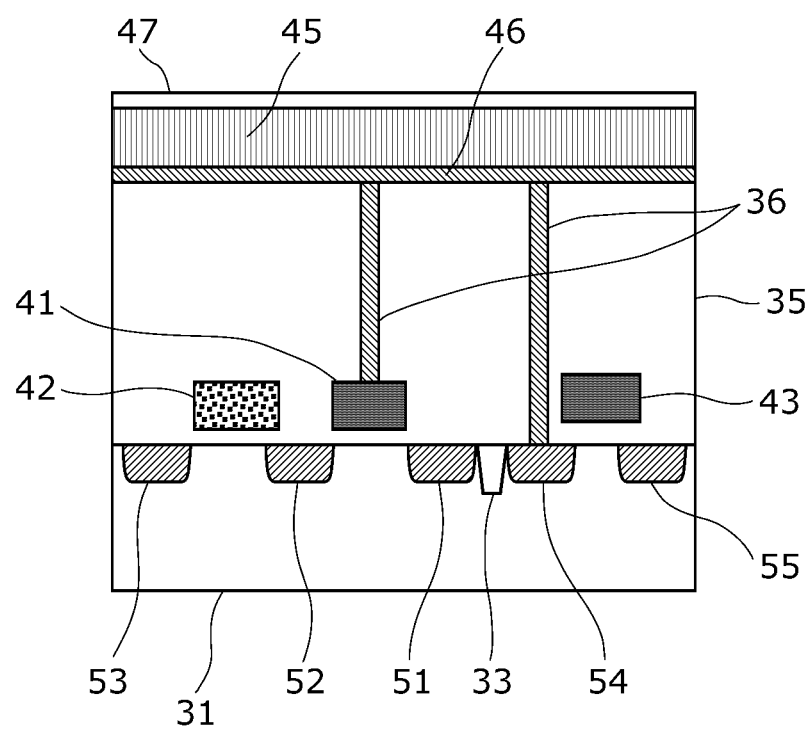
FIG. 2 is a cross-sectional view of a solid-state imaging device according to Comparison Example 1.

FIG. 1 illustrates a solid-state imaging device 50 according to Comparison Example 1. FIG. 2 is a cross-sectional view illustrating a configuration of a pixel 11 in FIG. 1.

The solid-state imaging device 50 shown in FIG. 1 includes a semiconductor substrate 31, the pixels 11, a vertical scanning unit 13, a horizontal scanning unit 15, vertical signal lines 114, first amplifier circuits 108, and feedback lines 115. Here, the pixels 11 are disposed in a matrix on the semiconductor substrate 31. The vertical scanning unit 13 supplies various timing signals to the pixels 11. The horizontal scanning unit 15 sequentially reads the signals from the pixels 11 to a horizontal output terminal 142. The vertical signal lines 114 are each provided for a different one of columns. The first amplifier circuits 108 are connected to the vertical signal lines 114. The feedback lines 115 are each provided for a different one of the columns to feedback an output signal from the first amplifier circuit 108 to the pixels 11 belonging to a corresponding one of the columns. In FIG. 1, only the pixels 11 of "two rows and columns" are described. However, the number of rows and the number of columns may be arbitrarily set.

Moreover, the pixels 11 each include a photoelectric conversion unit 120, an amplification transistor 105 the gate of which is connected to the photoelectric conversion unit 120, a reset transistor 116 the drain of which is connected to the photoelectric conversion unit 120, and a select transistor 113 connected in series with the amplification transistor 105.

As shown in FIG. 2, the photoelectric conversion unit 120 includes a photoelectric conversion film 45 for photoelectrical conversion, a pixel electrode 46 formed on the semiconductor substrate side, on the photoelectric conversion film 45, and a transparent electrode 47 formed on the side opposite to the pixel electrode 46, on the photoelectric conversion film 45. This photoelectric conversion unit 120 is connected between (i) a photoelectric conversion unit control line 131 and (ii) the gate of the amplification transistor 105 and the drain of the reset transistor 116. The amplification transistor 105 includes a gate connected to the pixel electrode 46, and outputs a signal voltage according to the potential of the pixel electrode 46 to the vertical signal line 114 via the select transistor 113. Here, the potential of the pixel electrode 46 is determined by dividing charges obtained through photoelectric conversion by the parasitic capacitor of a node connected to the gate of the amplification transistor 105. The parasitic capacitor corresponds to the total of capacitor between the node and nodes having fixed potentials such as ground potentials, and is storage capacitor.

One of the source and drain of the reset transistor 116 is connected to the pixel electrode 46. The other is connected to a corresponding one of the feedback lines 115. The gate of the select transistor 113 is connected to the vertical scanning unit 13 via an address control line 121. The gate of the reset transistor 116 is connected to the vertical scanning unit 13 via a reset control line 123. The address control lines 121 and the reset control lines 123 are each provided for a different one of rows. This comparison example shows the case where the reset transistor 116 is an n-MOS transistor, a reset pulse included in a reset signal to be inputted to the gate of the reset transistor 116 is a positive pulse (upward pulse), and the trailing edge of the reset pulse is an falling edge.

The photoelectric conversion unit control line 131 is shared by all the pixels. The vertical signal lines 114 are each provided for a different one of the columns, and are connected to the horizontal scanning unit 15 via column signal processing units 21. The column signal processing units 21 perform, for example, noise suppression signal processing represented by correlated double sampling and analog-to-digital conversion.

Moreover, the vertical signal lines 114, each provided for one of the columns, are respectively connected to the first amplifier circuits 108. A reference voltage VR which is common among all the pixels is also inputted to the first amplifier circuit 108. The output terminal of the first amplifier circuit 108 is connected to the source of the reset transistor 116. When the select transistor 113 and the reset transistor 116 are conducted, the first amplifier circuit 108 receives an output signal from the select transistor 113, and performs a feedback operation such that the gate potential of the amplification transistor 105 is constant. Here, an output signal from the first amplifier circuit 108 is a positive voltage of 0 V or around 0 V.

Figure 3:
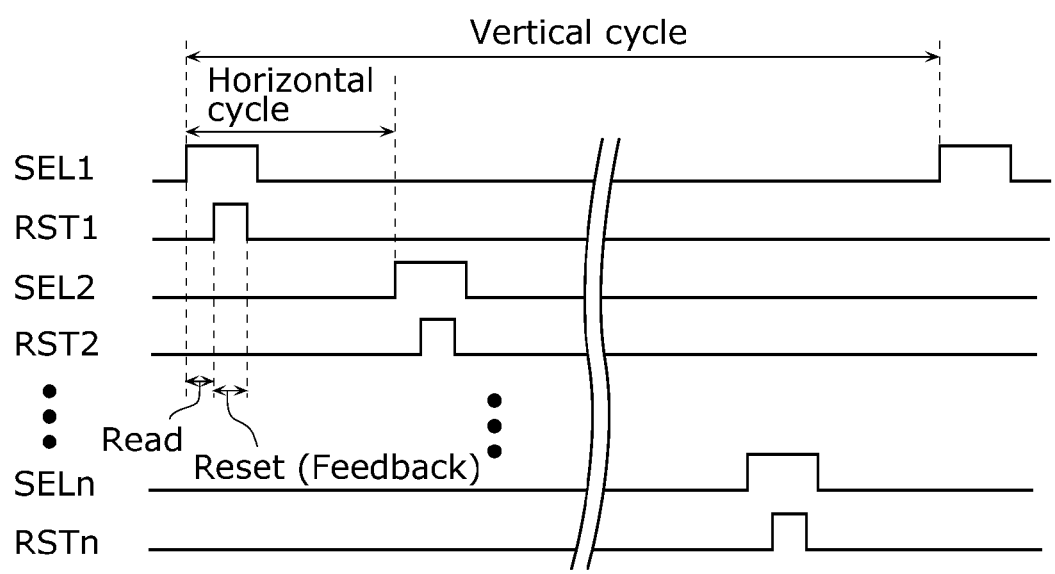
FIG. 3 is a timing chart illustrating the operation of a solid-state imaging device according to Comparison Example 1.

FIG. 3 is a timing chart showing the most basic imaging operation of the solid-state imaging device 50. SEL1 in FIG. 3 indicates a row selection signal for the first row. RST1 indicates a row reset signal for the first row. SEL2 and RST2 are the same as SEL1 and RST1 except corresponding rows. One horizontal cycle is a period from when a row selection signal is enabled until the next row selection signal is enabled (from the rising edge of SEL1 until the rising edge of SEL2), and is a period necessary for reading signal voltages from the pixels of one row. One vertical cycle is a period necessary for reading signal voltages from the pixels of all rows.

The feedback operation is performed when the row selection signal and the row reset signal are concurrently enabled. That is, the feedback operation is performed when the select transistor 113 and the reset transistor 116 are concurrently turned on. As shown in FIG. 3, the vertical scanning unit 13 controls such that the reset (feedback operation) is performed after signals are read from the pixels. The vertical scanning unit 13 enables a row selection signal to be supplied to the gate of the select transistor 113. This outputs an output signal from the amplification transistor 105 to the vertical signal line 114. Subsequently, the vertical scanning unit 13 enables a row reset signal with a certain time interval after the row selection signal is enabled. Thus, an output signal from the first amplifier circuit 108 is fed back to a pixel electrode via the reset transistor 116.

Generally, the frequency of a noise generated when signal charges are reset is GHz-order or greater. It is difficult to control this noise using a circuit. However, a noise frequency can be lowered by doing the following. Therefore, this noise can be controlled. While gradually decreasing a voltage to be applied to the reset control line 123, the feedback operation is performed. The channel resistance of the reset transistor 116 increases with a decrease in the voltage of the reset control line 123. This channel resistance and the storage capacitor form a kind of low-pass filter. Therefore, a noise having a frequency not greater than the cut-off frequency of this filter is prevented from passing through the reset transistor 116. When this cut-off frequency is below or equal to the band of this feedback circuit, all the noises are suppressed by feedback control.

Thus, a reset noise generated when the reset transistor 116 resets signal charges is suppressed by the feedback operation. This reduces the superimposition of the reset noise on the next signal charge. Thus, the solid-state imaging device 50 can suppress a random noise.

Moreover, the amplification transistor 105, the select transistor 113, and the reset transistor 116 are formed on the semiconductor substrate 31 formed of silicon as shown in FIG. 2. The amplification transistor 105 includes a gate electrode 41, a diffusion layer 51 as a drain, and a diffusion layer 52 as a source. The select transistor 113 includes a gate electrode 42, a diffusion layer 52 as a drain, and a diffusion layer 53 as a source. The source of the amplification transistor 105 and the drain of the select transistor 113 are the common diffusion layer 52. The reset transistor 116 includes a gate electrode 43, a diffusion layer 54 as a drain, and a diffusion layer 55 as a source. The diffusion layer 51 and the diffusion layer 54 are isolated by an element isolation region 33.

Moreover, an insulating film 35 is formed on the semiconductor substrate 31 to cover each transistor. The photoelectric conversion unit 120 is formed on the insulating film 35. The photoelectric conversion unit 120 includes the photoelectric conversion film 45 of amorphous silicon or others, the pixel electrode 46 formed on the bottom surface of the photoelectric conversion film 45, and the transparent electrode 47 formed on the top surface of the photoelectric conversion film 45. The pixel electrode 46 is connected via contacts 36 to the gate electrode 41 of the amplification transistor 105 and the diffusion layer 54 (source) of the reset transistor 116. The diffusion layer 54 connected to the pixel electrode 46 functions as a storage diode.

As described above, since a photoelectric conversion unit having a large optical-absorption coefficient is used, quantization efficiency is remarkably better in the solid-state imaging device 50 according to Comparison Example 1.

Moreover, in the solid-state imaging device 50 according to Comparison Example 1, since the area of a photodiode can be reduced, a conversion gain can be increased in a circuit. Furthermore, since photoelectric conversion is not performed for structural reasons in the semiconductor substrate, effects obtained when a random noise is suppressed are remarkably large.

Furthermore, reset noises generated in the stacked solid-state imaging device 50 can be suppressed by causing the first amplifier circuits 108 to perform feedback operations. A reset noise to be superimposed on signal charges to be read is reduced. Therefore, a random noise can be suppressed in the solid-state imaging device 50.

Comparison Example 2

In Comparison Example 1, three transistors are provided per pixel. For further miniaturization, it is necessary to reduce the number of transistors per pixel. As a method of reducing the number of transistors per pixel in a CMOS image sensor including a general embedded photodiode, a method of sharing the reset transistor, the amplification transistor, and the select transistor among photoelectric conversion units is generally known.

Therefore, the following describes, in a similar way as above, the case where the reset transistor, the amplification transistor, and the select transistor are shared by photoelectric conversion units in the stacked solid-state imaging device.

Figure 4:
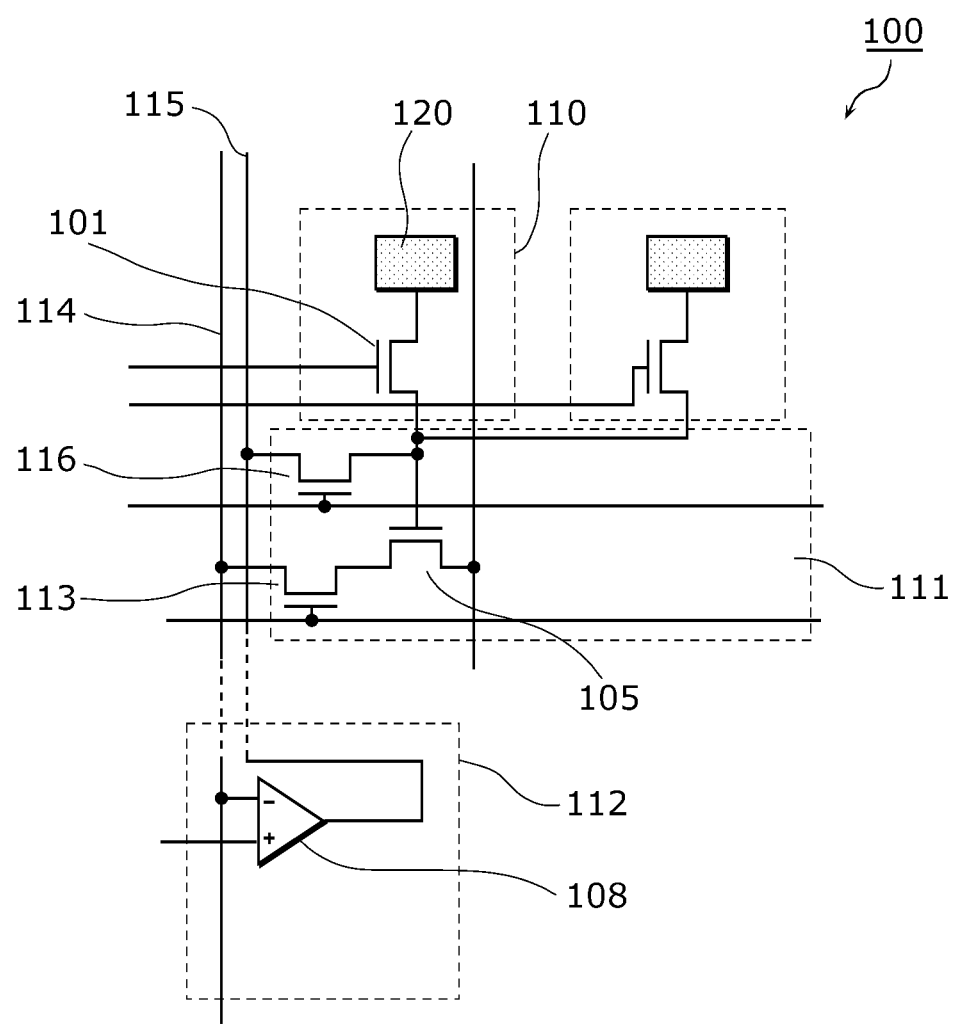
FIG. 4 is a circuit diagram of a solid-state imaging device according to Comparison Example 2.

FIG. 4 illustrates a configuration of a solid-state imaging device 100 according to Comparison Example 2. It should be noted that FIG. 4 only illustrates the circuit configuration of two pixels for simplification.

In the solid-state imaging device 100 shown in FIG. 4, only a transfer transistor 101 is an essential transistor for each of the pixels 110. Other transistors including the amplification transistor 105, the select transistor 113, and the reset transistor 116 can be shared by the pixels 110. Therefore, the number of transistors per pixel can be reduced (this circuit shared by pixels) is hereinafter referred to as a pixel common circuit 111). For instance, if four pixels share the pixel common circuit 111, the number of transistors per pixel is 1.75.

Moreover, the solid-state imaging device 100 includes column circuits 112 each provided for one of the columns of the pixel common circuits 111. The column circuits 112 each include the first amplifier circuit 108.

Here, in the circuit shown in FIG. 4, it is necessary to reset to a predetermined voltage, a voltage to be inputted to the gate of the amplification transistor 105 (hereinafter referred to as a common circuit voltage). This is achieved by turning on the reset transistor 116 to match the common circuit voltage with the voltage of the feedback line 115 and turning off the reset transistor 116. Here, a kTC noise is generated.

To reduce the kTC noise generated in the reset transistor 116, the case where a driving similar to the driving shown in Comparison Example 1 is performed will be discussed in the following. The reset transistor 116 is turned on, and an output voltage from the first amplifier circuit 108 is inputted to the amplification transistor 105 as a common circuit voltage. A voltage corresponding to this voltage is outputted from the amplification transistor 105, and the outputted voltage is inputted to the negative input terminal of the first amplifier circuit 108 via the select transistor 113. A voltage source is connected to a positive input terminal, and a voltage obtained by subtracting a voltage inputted to the negative input terminal from a voltage from this voltage source is fed back to the common circuit voltage via the feedback line 115. The kTC noise generated in the reset transistor 116 is suppressed by gradually turning off the reset transistor 116 (reducing the gate voltage of the reset transistor 116) in this state.

However, in the circuit shown in FIG. 4, in addition to the reset of the common circuit voltage, it is also necessary to reset the voltage of a node of the transfer transistor 101 to which the photoelectric conversion unit 120 is connected (hereinafter referred to as a pixel voltage). For this, it is necessary to turn on and off the transfer transistor 101 when the common circuit voltage is reset. This generates a kTC noise due to the transfer transistor 101. However, this kTC noise cannot be suppressed by this circuit. This is because the transfer transistor 101 is not provided in the negative feedback loop described above and the control by this negative feedback cannot be expected. Furthermore, since a node having a pixel voltage needs to be isolated (floating), the configuration in which the transfer transistor 101 is placed in the negative feedback loop is impossible. That is, a switching circuit capable of suppressing the kTC noise by a new principle is necessary to suppress this kTC noise.

Embodiment 1

The following describes Embodiment 1 with reference to drawings. It should be noted that the same reference signs are given to elements similar to the elements described above, and the explanation will be omitted. Moreover, the following assumes an n-MOS transistor. However, a similar operation can be of course performed by a p-MOS transistor. The source/drain of a transistor in the following description means one of the source and drain of the transistor (such expression is used because the source and the drain are the same and cannot be distinguished from each other in an actual element). However, when a voltage applied to one of these is higher than a voltage applied to the other, the drain is chosen.

The following describes a configuration of a solid-state imaging device according to Embodiment 1.

Figure 5:
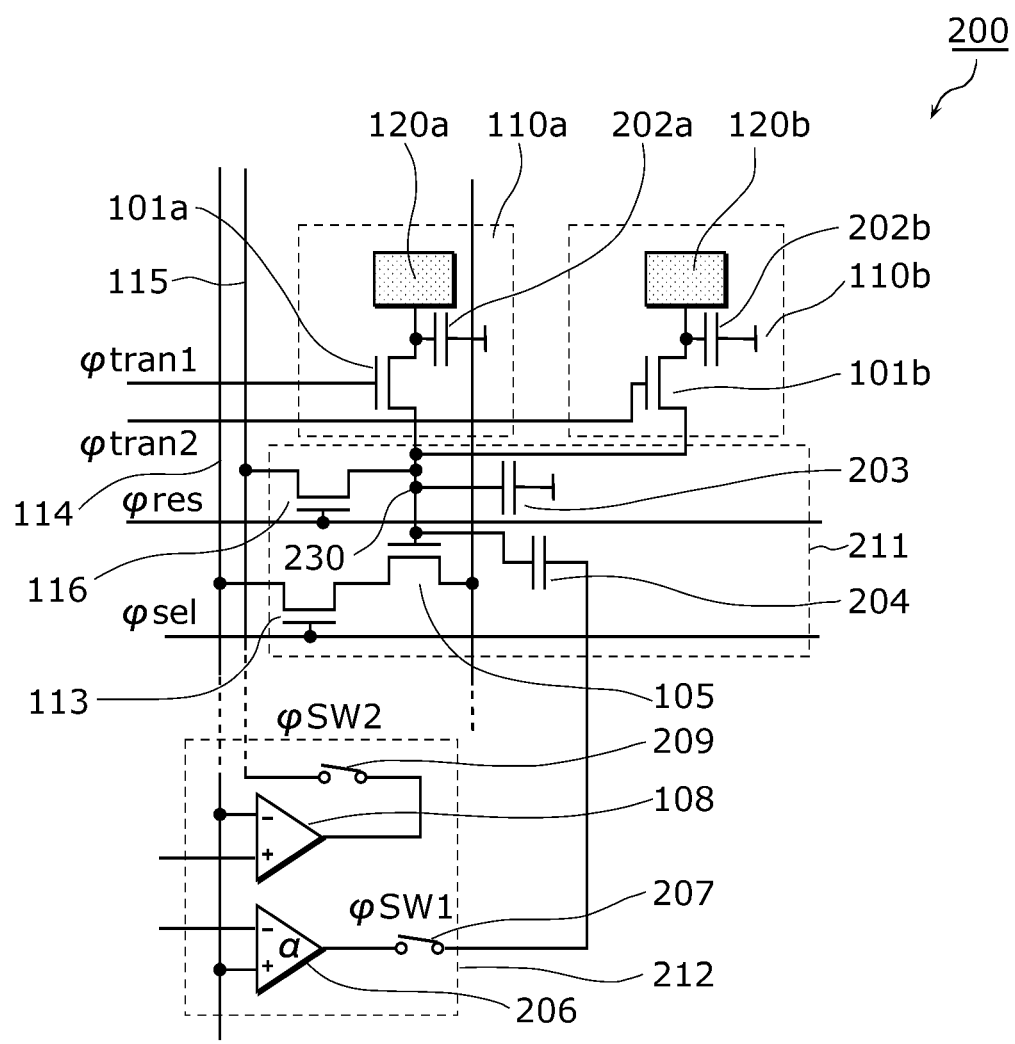
FIG. 5 is a circuit diagram of a solid-state imaging device according to Embodiment 1.

FIG. 5 is a circuit diagram of a solid-state imaging device 200 according to Embodiment 1. It should be noted that FIG. 5 only illustrates a circuit configuration of two pixels for simplification.

The solid-state imaging device 200 shown in FIG. 5 is a stacked solid-state imaging device, and includes pixels 110 and pixel common circuits 211 each provided for a set of two or more pixels of the pixels 110.

The pixels 110 each include (110a or 110b includes) a photoelectric conversion unit 120 (120a or 120b) and a transfer transistor 101 (101a or 101b) connected to the photoelectric conversion unit 120.

The pixel common circuits 211 each include an accumulation unit 230, an amplification transistor 105, a select transistor 113, a reset transistor 116, and a capacitative element 204 which are connected to the two or more transfer transistors 101 of the corresponding two or more pixels 110.

In this configuration, the pixel common circuit 211 is shared by more than one pixel 110 by turning on one of the transfer transistors 101 connected to the pixel common circuit 211. The pixels 110 and the pixel common circuits 211 are, in fact, disposed two-dimensionally.

Moreover, the solid-state imaging device 200 includes column circuits 212 each provided for one of the columns of the pixel common circuits 211.

It should be noted that an overall configuration of the solid-state imaging device 200 except pixel units (the pixels 110 and the pixel common circuits 211) and the column circuits 212 is similar to the configuration shown in FIG. 1, and the explanation will be omitted.

Moreover, FIG. 5 shows the capacitance of a node of the transfer transistor 101 to which the photoelectric conversion unit 120 is connected, as capacitor 202 (202a or 202b) and shows the capacitance of the accumulation unit 230 as capacitor 203. The capacitor 202 and the capacitor 203 correspond to the total value of all the capacitor including not only an intentionally-added capacitor, but also the parasitic capacitor between the node and lines to which a constant voltage is being applied. The parasitic capacitor is always present in an actual circuit. Therefore, even if a capacitor is not intentionally added, the capacitor 202 and the capacitor 203 are always present. Here, the constant voltage source is a node whose voltage does not change during an operation step performed by the solid-state imaging device 200 described below.

The photoelectric conversion unit 120 converts light into signal charges, and accumulates the signal charges obtained through the conversion. It should be noted that the configuration of the photoelectric conversion unit 120 is similar to the configuration shown in Comparison Example 1 described above.

The accumulation unit 230 accumulates the signal charges obtained through the photoelectric conversion by the photoelectric conversion unit 120.

The transfer transistor 101 is connected between the photoelectric conversion unit 120 and the accumulation unit 230, and transfers to the accumulation unit 230, the signal charges obtained through the conversion by the photoelectric conversion unit 120.

The gate of the amplification transistor 105 is connected to the accumulation unit 230, and generates a voltage signal according to the signal charges (voltage) accumulated in the accumulation unit 230.

The reset transistor 116 is connected between the accumulation unit 230 and the feedback line 115. In the vertical scanning operation of the solid-state imaging device 200, when the reset transistors 116 in a selected row are turned on, voltages from the feedback lines 115 reset the voltages of the accumulation units 230.

Moreover, in the scanning operation of the solid-state imaging device 200, only the select transistors 113 in the selected row are turned on. When the select transistors 113 are turned on, voltage signals generated by the amplification transistors 105 are outputted to the vertical signal lines 114. The select transistor 113 is connected in series with the amplification transistor 105.

It should be noted that the select transistor 113 may be placed between the amplification transistor 105 and the vertical signal line 114 as shown in FIG. 5 or may be placed between the amplification transistor 105 and the power source.

Moreover, the function of turning on and off of the amplification transistor 105 is added by setting a threshold value for the amplification transistor 105, and a configuration without the select transistor 113 can be also considered as another configuration. This configuration is generally known, and the explanation will be omitted.

Moreover, the amplification transistor 105 may operate as a source follower by connecting a current source (typically a transistor) to the vertical signal line 114.

The column circuit 212 is shared by the pixel common circuits 211 placed in the same column among the pixel common circuits 211 placed two-dimensionally. The column circuits 212 each include the first amplifier circuit 108, a second amplifier circuit 206, and switches 207 and 209.

The first amplifier circuit 108 is typically an operational amplifier. The first amplifier circuit 108 negatively feeds back a voltage signal generated by the amplification transistor 105 to the reset transistor via the feedback line 115. Specifically, the negative input terminal (inversion input terminal) of the first amplifier circuit 108 is connected to the vertical signal line 114. This inputs a voltage signal generated by the amplification transistor 105 to the negative input terminal of the first amplifier circuit 108 via the select transistor 113 and the vertical signal lines 114. Moreover, a constant voltage (reference voltage) is being applied to the positive input terminal (non-inversion input terminal) of the first amplifier circuit 108.

The switch 209 is connected between the output terminal of the first amplifier circuit 108 and the feedback line 115. Therefore, the output terminal of the first amplifier circuit 108 is connected to the drain of the reset transistor 116 via the switch 209 and the feedback line 115.

The second amplifier circuit 206 is typically an operational amplifier. The second amplifier circuit 206 negatively feeds back a voltage signal generated by the amplification transistor 105 to the gate of the amplification transistor 105 via the capacitative element 204. Specifically, the positive input terminal of the second amplifier circuit 206 is connected to the vertical signal line 114, and a constant voltage (reference voltage) is being applied to the negative input terminal of the second amplifier circuit 206. Thus, the voltage signal generated by the amplification transistor 105 is inputted to the positive input terminal of the second amplifier circuit 206 via the vertical signal line 114.

The switch 207 is connected between the output terminal of the second amplifier circuit 206 and one terminal of the capacitative element 204. Moreover, the other terminal of the capacitative element 204 is connected to the accumulation unit 230. Moreover, one terminal of the switch 207 is connected to the capacitative elements 204 arranged in the same column.

It should be noted that the switch 207 shown in FIG. 5 may be placed between the vertical signal line 114 and the positive input terminal of the second amplifier circuit 206. In this case, the output terminal of the second amplifier circuit 206 and the capacitative element 204 are directly connected. This means that the switch 207 is provided for switching between on and off of the feedback loop including the second amplifier circuit 206. Therefore, the switch 207 may be placed at any place in the feedback loop.

Moreover, the capacitance value of the capacitative element 204 includes not only the capacitance value of an intentionally-added capacitor, but also the value of parasitic capacitor.

Moreover, in FIG. 5, a voltage to be applied to the gate of the transfer transistor 101a is φtran1, and a voltage to be applied to the gate of the transfer transistor 101b is φtran2. In general, these voltages are concurrently applied by a horizontally-arranged line to all the pixels 110 of the same row.

Moreover, a voltage to be applied to the gate of the reset transistor 116 is φres. In general, this voltage is also concurrently applied by the horizontally-arranged line to all the pixel common circuits 211 of the same row.

Moreover, a voltage to be applied to the gate of the select transistor 113 is φsel. In general, this voltage is also concurrently applied by the horizontally-arranged line to all the pixel common circuits 211 of the same row.

A control voltage to be applied to the switch 207 is φSW1. When this voltage is in a high level, the switch 207 is turned on. When this voltage is in a low level, the switch 207 is turned off. A control voltage to be applied to the switch 209 is φSW2. When this voltage is in a high level, the switch 209 is turned on. When this voltage is in a low level, the switch 209 is turned off.

It should be noted that these control signals are generated by the vertical scanning unit 13 shown in FIG. 1 or a control circuit or the like which is not shown in the drawings, and applied to each transistor or each switch.

The following describes a method of driving the solid-state imaging device 200. It should be noted that although not shown in FIG. 5, the read operation of a signal obtained in each pixel 110 using the vertical scanning operation and the horizontal scanning operation is similar to a read operation performed in a normal solid-state imaging device. This is apparent to those skilled in the art. Therefore, the following only describes a method of driving based on each pixel 110.

Moreover, here, the pixel 110b is scanned following the pixel 110a in the vertical scanning operation. That is, the following assumes that the pixel 110a and the pixel 110b are vertically adjacent. It should be noted that the case where the pixel 110a and the pixel 110b are placed horizontally or obliquely can be also assumed. However, even in such case, the driving is of course possible based on the method which will be described below.

Four operations: (1) an accumulated signal read operation, (2) a reset operation, (3) a reset voltage read operation, and (4) an accumulation operation are necessary for driving the pixel 110.

In the case of capturing a moving picture, the operations (1) to (4) are cyclically performed. In the case of capturing a still picture, the operations start with (2) the reset operation, which is sequentially followed by (3) the reset voltage read operation and (4) the accumulation operation, and end with (1) the accumulated signal read operation.

Moreover, when an electronic shutter is used, an electronic shutter reset operation is performed during (4) the accumulation operation. Furthermore, when the electronic shutter is used, (3) the reset voltage read operation is not performed.

Figure 6:
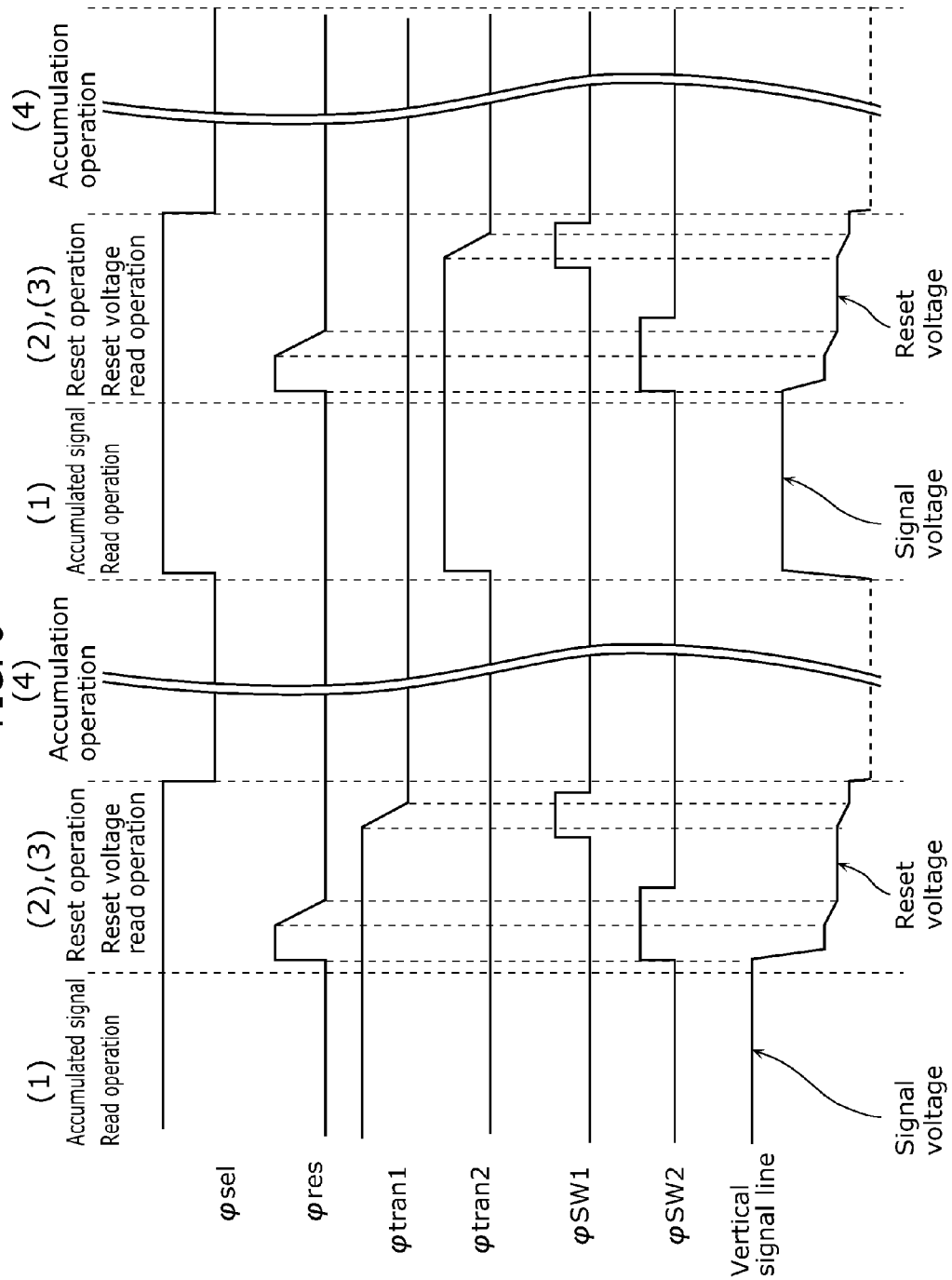
FIG. 6 is a timing chart illustrating the operation of a solid-state imaging device according to Embodiment 1.

FIG. 6 is a figure for explaining a method of driving the solid-state imaging device 200. The operations (1) to (4) will be described in order with reference to FIG. 6.

The following describes (1) the accumulated signal read operation.

The transfer transistor 101a and the select transistor 113 are turned on by setting φtran1 and φsel to a high level. This transfers signal charges accumulated according to the amount of light irradiation from the photoelectric conversion unit 120 to the accumulation unit 230. A signal voltage according to the accumulated signal charges is outputted to the vertical signal line 114. Moreover, although not shown in FIG. 5, a correlated double sampling circuit (CDS circuit) and others are generally connected to the vertical signal line 114. This voltage is sampled by the CDS circuit.

The following describes (2) the reset operation and (3) the reset voltage read operation.

In the state in which the transfer transistor 101a and the select transistor 113 are turned on, the negative feedback circuit including the first amplifier circuit 108, the reset transistor 116, and the amplification transistor 105 is put into operation by setting φres and φSW2 to a high level. The reset transistor 116 is gradually turned off by gradually reducing φres to a low level. This can reduce a kTC noise due to the reset transistor 116.

After that, the switch 209 is turned off by setting φSW2 to a low level. In this state, a reset voltage corresponding to the voltage of the accumulation unit 230 in a reset state is outputted to the vertical signal line 114. This voltage is sampled as a reset voltage by a correlated double sampling circuit (CDS circuit) or the like. After that, the switch 207 is turned on by setting φSW1 to a high level. Then, the transfer transistor 101a is turned off by gradually reducing φtran1 to a low level. This can reduce a kTC noise generated by the transfer transistor 101a. It should be noted that details about this principle will be described later.

In (4) the accumulation operation, the pixel 110a and the pixel common circuit 211 remain in a state same as the state at the end of (3) the reset voltage read operation. This accumulates charges according to incident light in the photoelectric conversion unit 120. Moreover, when an electronic shutter is not used, the above mentioned period is one frame.

It should be noted that operations after this shown in FIG. 6 are operations for the pixel 110b, and are the same operations as for the pixel 110a. Therefore, detailed explanation will be omitted.

Moreover, signals from a row for which (1) the accumulated signal read operation, (2) the reset operation, and (3) the reset voltage read operation are completed are sequentially outputted to the outside of the solid-state imaging device 200. This operation is apparent to those skilled in the art. Therefore, detailed explanation will be omitted.

The following describes a principle by which a kTC noise generated in the transfer transistor 101 of the solid-state imaging device 200 according to Embodiment 1 can be suppressed.

Figure 7:
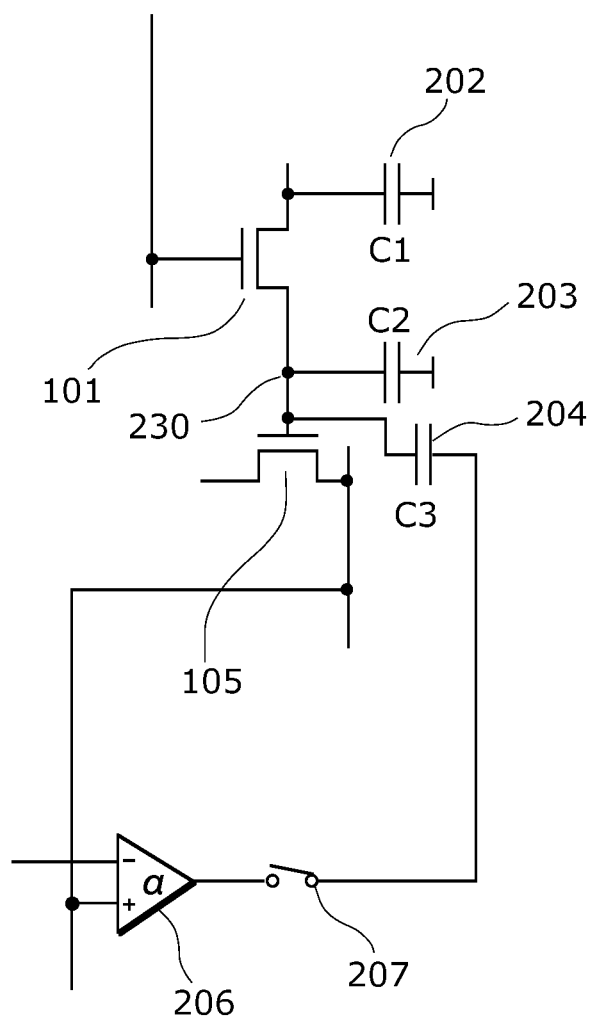
FIG. 7 is a circuit diagram of a switching circuit according to Embodiment 1.

FIG. 7 illustrates a configuration of a circuit relating to the positive feedback operation described above extracted from the circuit shown in FIG. 5. Moreover, the circuit shown in FIG. 7 is hereinafter referred to as a switching circuit. It should be noted that this switching circuit can be not only used in the above solid-state imaging device, but also used in a circuit which needs other similar switching operation.

Moreover, the capacitance value of the capacitor 202 is C1. The capacitance value of the capacitor 203 is C2. The capacitance value of the capacitative element 204 is C3. Moreover, the gain of the second amplifier circuit 206 is α.

The transfer transistor 101 is turned on, and the potential of the capacitor 202 and the potential of the accumulation unit 230 are matched. Many methods for potential setting can be considered. For instance, giving the accumulation unit 230 a potential via another switch (hereinafter referred to as a potential setting switch) can be considered. For instance, this potential setting switch is the above reset transistor 116. This is Step 1.

After this, only the transfer transistor 101 is connected to the capacitor 203. Only the transfer transistor 101, the amplification transistor 105, and the capacitative element 204 are connected to the accumulation unit 230. When the potential setting switch is used, the potential setting switch is switched off at this timing. To be precise, a kTC noise is generated at this time. However, the following description is based on the assumption that this noise is not present (the kTC noise can be substantially suppressed to zero by using the negative feedback including the first amplifier circuit 108 described above). This is Step 2.

After Step 2, the transfer transistor 101 is turned off. Generally (when the voltage of the node between the switch 207 and the capacitative element 204 is constant in FIG. 7), the following described kTC noise is generated. The charge amount of this kTC noise is determined by the series capacitance value of C1 and C2+C3. Thus, the standard deviation of the kTC noise is expressed by the following expression (1).

[Expression 1]

$$\sqrt{\frac{kT(C2+C3)C1}{C1+C2+C3}} \tag{1}$$

Thus, the standard deviation of a noise voltage detected in the amplification transistor 105 is expressed by the following expression (2).

[Expression 2]

$$\sqrt{\frac{kTC1}{(C1+C2+C3)(C2+C3)}} \tag{2}$$

Here, k is a Boltzmann constant, and T is an absolute temperature of this system. For this, when the following operations are performed, this kTC noise can be reduced.

After Step 2, the switch 207 is turned on, and a feedback loop including the second amplifier circuit 206 is turned on. After that, the gate voltage of the transfer transistor 101 is gradually decreased. At the point when this gate voltage is around the threshold voltage of the transfer transistor 101, the channel resistance of the transfer transistor 101 increases. Therefore, a noise voltage Vn due to the transfer transistor 101 is detected by the amplification transistor 105. This voltage is amplified by the second amplifier circuit 206, and a voltage value αVn is outputted to the capacitative element 204.

The following discusses charges Qn due to a noise to be charged in C2 and C3 at this time. Here, charges on the amplification transistor 105 side are positive. Only the voltage Vn is charged due to the noise voltage Vn in C2. The noise charges to be charged in C2 are C2×Vn.

Moreover, a voltage difference between the two terminals of C3 is (Vn−α)×Vn due to the noise voltage Vn. Therefore, the noise charges in C3 are C3×(Vn−α)×Vn.

Therefore, the charges Qn are expressed by the following expression (3).

$$Qn = C2 \times Vn + C3 \times (Vn - a) \times Vn \tag{3}$$

$$= \{C2 + (1-a) \times C3\} \times Vn$$

Considering that the definition of the capacitance value is the proportionality coefficient of charges to a voltage, it is clear that {C2+(1−α)×C3} behaves like a capacitance value for the charges Qn and the voltage Vn.

Therefore, at this time, the standard deviation of the kTC noise charges is expressed by the expression in which C2+C3 in Expression (1) is replaced by {C2+(1−α)×C3}. That is, the standard deviation of the kTC noise charges is expressed by the following expression (4).

[Expression 3]

$$\sqrt{\frac{kT\{C2+(1-\alpha)C3\}C1}{C1+C2+(1-\alpha)C3}} \tag{4}$$

Furthermore, the following expression (4) can be approximated to the following expression (5) by setting α and C3 such that C2+(1−α)×C3<<C1, C2.

[Expression 4]

$$\sqrt{kT\{C2+(1-\alpha)C3\}} \tag{5}$$

That is, it is clear that the kTC noise can be decreased with a decrease in C2+(1−α)×C3.

In reality, when C2+(1−α)×C3 approximates zero, Vn is infinitely spread. Therefore, there are some limits for the reduction of the kTC noise. However, for the value shown in Expression (1), decreasing of the value shown in Expression (4) to one tenth is possible.

That is, it is preferable that the product of the capacitance value C3 of the capacitative element 204 and the gain α of the second amplifier circuit 206 be substantially the same as the capacitance value C2 of the accumulation unit 230. Specifically, it is preferable that the product of the capacitance value C3 and the gain α be 0 to 10% less than the capacitance value (C2+C3).

Thus, the solid-state imaging device 200 according to Embodiment 1 uses the positive feedback including the second amplifier circuit 206. This can suppress a kTC noise generated in the reset transistor 116 and the kTC noise generated in the transfer transistor 101, in the solid-state imaging device 200.

Embodiment 2

The following describes Embodiment 2 with reference to drawings. It should be noted that the following mainly describes differences from Embodiment 1, and overlapping explanation will be avoided.

Figure 8:
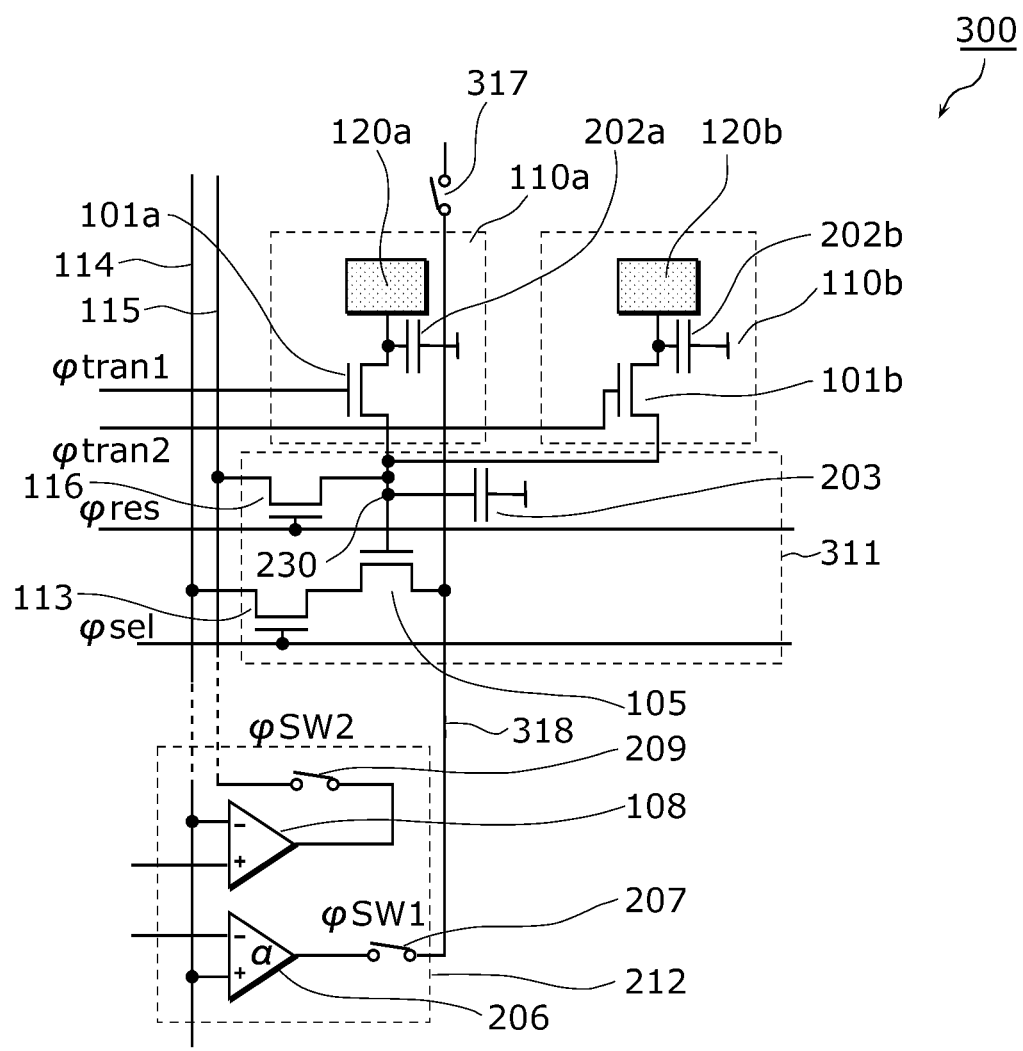
FIG. 8 is a circuit diagram of a solid-state imaging device according to Embodiment 2.

FIG. 8 is a circuit diagram of a solid-state imaging device 300 according to Embodiment 2.

The solid-state imaging device 300 shown in FIG. 8 is different from the solid-state imaging device 200 shown in FIG. 5 in that the output terminal of the second amplifier circuit 206 is connected to the source of the amplification transistor 105. That is, a pixel common circuit 311 does not include the capacitative element 204 shown in FIG. 5.

Moreover, the solid-state imaging device 300 further includes a switch 317 and a power source line 318.

Specifically, the output terminal of the second amplifier circuit 206 is connected to the drain of the amplification transistor 105 via the switch 207 and the power source line 318. That is, the second amplifier circuit 206 positively feeds back a voltage signal generated by the amplification transistor 105 to the drain of the amplification transistor 105 via the power source line 318.

The power source line 318 is connected to the drain of the amplification transistor 105, and is used for supplying a voltage to the drain of the amplification transistor 105. The switch 317 is connected between the power source line 318 and a power source. Moreover, the power source line 318 is connected to the amplification transistors 105 arranged in the same column.

The method of driving the solid-state imaging device 300 is almost the same as Embodiment 1. However, a difference is in that the capacitative element 204 in the solid-state imaging device 200 shown in FIG. 5 is not provided in this circuit, and instead, the drain-gate capacitance of the amplification transistor 105 is used. The following describes the operation of solid-state imaging device 300 according to Embodiment 2 in comparison with the operation in Embodiment 1.

During (1) the accumulated signal read operation, the switch 317 is turned on and the switch 207 is turned off, and a power source is connected to the drain of the amplification transistor 105. Thus, a similar operation as Embodiment 1 can be performed.

Nothing changes at the beginning of (2) the reset operation and (3) the reset voltage read operation. By turning off the switch 317 after the switch 207 is turned on, the output terminal of the second amplifier circuit 206 is connected to the drain of the amplification transistor 105. This operates a positive feedback circuit. Moreover, in this state, the drain-gate capacitance is present between the output terminal of the second amplifier circuit 206 and the gate of the amplification transistor 105. This drain-gate capacitance functions like the capacitative element 204 in the solid-state imaging device 200 shown in FIG. 5. Therefore, the principle described in Embodiment 1 can suppress the kTC noise generated due to the transfer transistor 101.

After that, by turning on the switch 317 and turning off the switch 207, a power source is connected to the drain of the amplification transistor 105. Thus, a similar operation as Embodiment 1 can be performed.

Moreover, as with Embodiment 1 described above, it is preferable that the product of the capacitance value of the power source line 318 and the gain α of the second amplifier circuit 206 be substantially equal to the capacitance value C2 of the accumulation unit 230 in order to sufficiently decrease a kTC noise. Specifically, the product of the gain α and the capacitance value of the power source line 318 should be preferably 0 to 10% less than the sum of the capacitance value C2 and the capacitance value of the power source line 318.

Thus, as with the solid-state imaging device 200 according to Embodiment 1, it is possible to suppress a kTC noise generated in the reset transistor 116 and a kTC noise generated in the transfer transistor 101 in the solid-state imaging device 300 according to Embodiment 2.

Embodiment 3

The following describes Embodiment 3 with reference to drawings. It should be noted that the following mainly describes differences from Embodiment 1, and overlapping explanation will be avoided.

Figure 9:
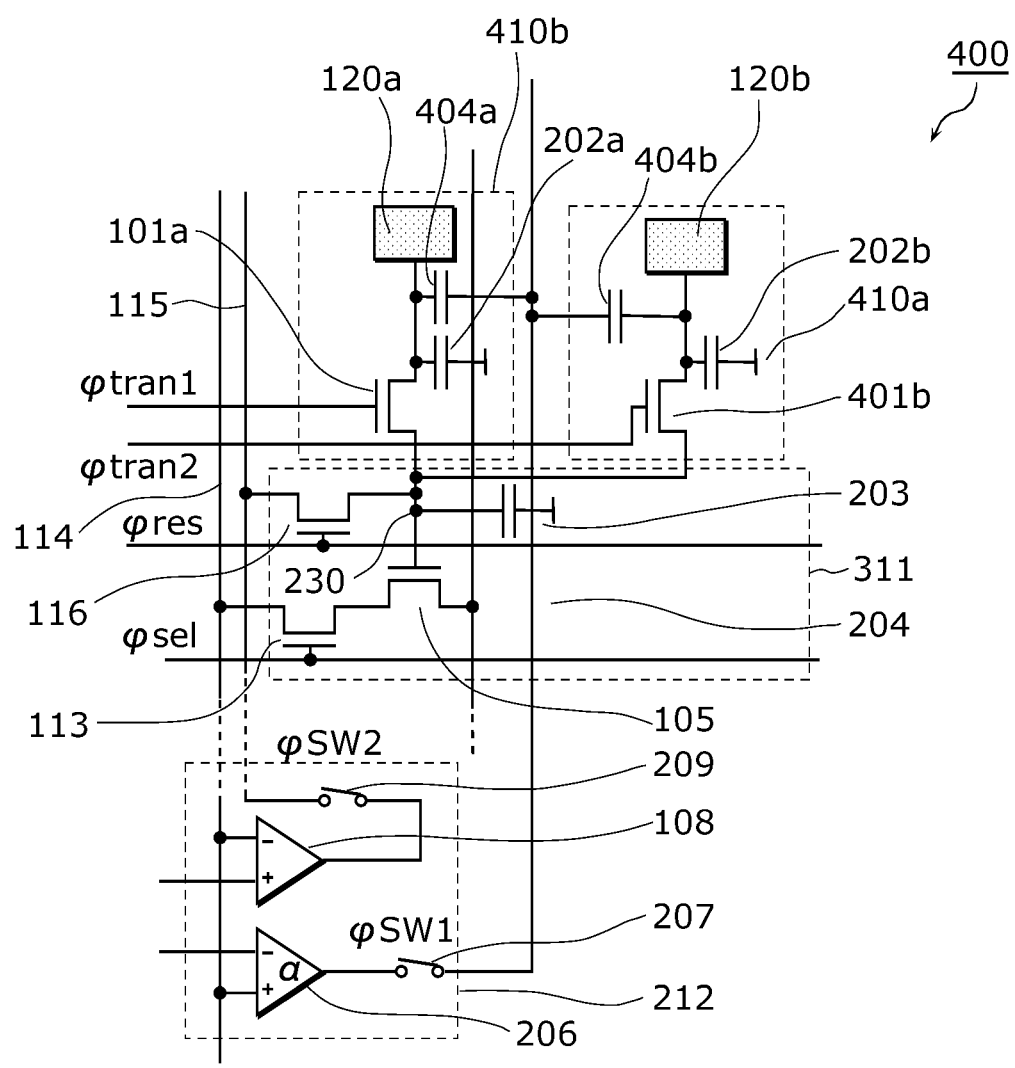
FIG. 9 is a circuit diagram of a solid-state imaging device according to Embodiment 3.

FIG. 9 is a circuit diagram of a solid-state imaging device 400 according to Embodiment 3.

The solid-state imaging device 400 shown in FIG. 9 is different from the solid-state imaging device 200 shown in FIG. 5 in that the output terminal of the second amplifier circuit 206 is connected via a capacitive element 404 to the node of the transfer transistor 101 to which the photoelectric conversion unit 120 is connected.

Specifically, a pixel 410 (410*a* or 410*b*) further includes the capacitative element 404 (404*a* or 404*b*). The output terminal of the second amplifier circuit 206 is connected to one terminal of the capacitative element 404 via the switch 207. The other terminal of the capacitative element 404 is connected to the node of the transfer transistor 101 to which the photoelectric conversion unit 120 is connected. It should be noted that the capacitance value of the capacitative element 404 not only includes the capacitance value of an intentionally-added capacitor, but also includes the value of parasitic capacitor. Moreover, one terminal of each of the capacitative elements 404 corresponding to pixel common circuits 311 arranged in the same column is connected to the switch 207 in the same column.

That is, the second amplifier circuit 206 positively feeds back a voltage signal generated by the amplification transistor 105 to the gate of the amplification transistor 105 via the capacitative element 404 and the transfer transistor 101.

It should be noted that the method of driving the solid-state imaging device 400 is the same as Embodiment 1, and the explanation will be omitted.

Moreover, as with Embodiment 1 described above, it is preferable that the product of the capacitance value of the capacitative element 404 and the gain α of the second amplifier circuit 206 be substantially equal to the capacitance value C2 of the accumulation unit 230 in order to sufficiently decrease a kTC noise. Specifically, the product of the gain α and the capacitance value of the capacitative element 404 should be preferably less than 0 to 10% less than the sum of the capacitance value C2 and the capacitance value of the capacitative element 404.

Thus, as with the solid-state imaging device 200 according to Embodiment 1, it is possible to suppress a kTC noise generated in the reset transistor 116 and a kTC noise generated in the transfer transistor 101 in the solid-state imaging device 400 according to Embodiment 3.

The solid-state imaging devices according to the embodiments of the present disclosure were described above. However, the present disclosure is not limited to these embodiments.

Moreover, each processing unit in a solid-state imaging device according to the embodiments is typically achieved as LSI which is an integrated circuit. These units may be integrated into individual one chip, or may be integrated into one chip to include some or all of these.

Moreover, in the cross-sectional views, the corners and sides of each structural element are linearly drawn. However, round corners and curved sides produced for manufacture reasons are also included in the present disclosure.

Moreover, some of the functions of a solid-state imaging device according to the above embodiments and a solid-state imaging device according to a modification of these embodiments may be combined.

Moreover, all the numbers used above are exemplified to specifically explain the present disclosure, and the present disclosure is not limited to the exemplified numbers. Furthermore, a logic level indicated by high or low or a switching state indicated by on or off is exemplified to specifically explain the present disclosure. It is possible to also obtain equivalent results by a different combination of the exemplified logic level or switching state. Moreover, for example the n-type and p type of the transistor are exemplified to specifically explain the present disclosure. It is possible to obtain equivalent results by reversing these. Moreover, to specifically explain the present disclosure is only the purpose of exemplifying the materials of the structural elements shown in the above. Therefore, the present disclosure is not limited to the exemplified materials. Moreover, the connections between the structural elements are exemplified to specifically explain the present disclosure, and the connections for achieving the function of the present disclosure are not limited to this.

Moreover, the division of the functional blocks in the block diagrams is just an example. Multiple functional blocks may be achieved as one functional block, one functional block may be divided into multiple blocks, or part of a function may be transferred to another functional block.

Moreover, the above describes an example in which a MOS transistor is used. However, a different kind of transistor may be used.

Moreover, the circuit configuration shown in the above circuit diagrams is just an example, and the present disclosure is not limited to the above circuit configuration. That is, as with the above circuit configuration, a circuit which can achieve the characteristic functions of the present disclosure is also included in the present disclosure. For instance, in the range where functions similar to the functions seen in the above circuit configuration can be achieved, the configuration in which an element is connected in series or parallel with an element such as a switching element (transistor), a resistance element, or a capacitative element is also included in the present disclosure. In other words, "connected" in the above embodiments is not limited to the case where two terminals (nodes) are directly connected, but the case where the two terminals (nodes) are connected via an element in the range where similar functions can be achieved is also included.

Furthermore, various modifications obtained by making some changes which those skilled in the art would conceive for these embodiments are also included in the present disclosure without departing from the scope of the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The present disclosure is applicable to a solid-state imaging device. Moreover, the present disclosure can be used for, for example, a digital still camera and a digital video camera which use a solid-state imaging device.

The invention claimed is:
1. A solid-state imaging device comprising:
    a photoelectric conversion unit configured to convert light into signal charges;
    an accumulation unit configured to accumulate the signal charges;
    a transfer transistor connected between the photoelectric conversion unit and the accumulation unit for transferring to the accumulation unit, the signal charges obtained through the conversion by the photoelectric conversion unit;
    an amplification transistor for amplifying the signal charges accumulated in the accumulation unit to generate a voltage signal, the amplification transistor having a gate connected to the accumulation unit;
    a reset transistor for resetting a voltage of the accumulation unit;
    a first amplification circuit for negatively feeding back the voltage signal generated by the amplification transistor to the reset transistor; and
    a second amplification circuit for positively feeding back the voltage signal generated by the amplification transistor to the amplification transistor.
2. The solid-state imaging device according to claim 1, performing a first step and a second step,
    wherein in the first step, the reset transistor is turned off while negatively feeding back the voltage signal to the reset transistor, by causing the first amplification circuit to operate after the transfer transistor and the reset transistor are turned on, and
    in the second step, the transfer transistor is turned off while positively feeding back the voltage signal to the gate of the amplification transistor, by causing the second amplification circuit to operate after the reset transistor is turned off and the transfer transistor is turned on.
3. The solid-state imaging device according to claim 1, further comprising
    a capacitative element connected between the gate of the amplification transistor and an output terminal of the second amplification circuit,
    wherein the second amplification circuit positively feeds back the voltage signal to the gate of the amplification transistor via the capacitative element.
4. The solid-state imaging device according to claim 3, wherein a product of a capacitance value of the capacitative element and a gain of the second amplification circuit is substantially equal to a capacitance value of the accumulation unit.
5. The solid-state imaging device according to claim 1, further comprising
    a power source line for supplying a voltage to one of a source and a drain of the amplification transistor,
    wherein the second amplification circuit positively feeds back the voltage signal to the one of the source and the drain of the amplification transistor via the power source line.
6. The solid-state imaging device according to claim 5, wherein a product of a capacitance value of the power source line and a gain of the second amplification circuit is substantially equal to a capacitance value of the accumulation unit.
7. The solid-state imaging device according to claim 1, further comprising
    a capacitative element connected between a first terminal and an output terminal of the second amplification circuit, the first terminal being connected to the photoelectric conversion unit and being a source or a drain of the transfer transistor,
    wherein the second amplification circuit positively feeds back the voltage signal to the gate of the amplification transistor via the capacitative element and the transfer transistor.
8. The solid-state imaging device according to claim 7, wherein a product of a capacitance value of the capacitative element and a gain of the second amplification circuit is substantially equal to a capacitance value of the accumulation unit.

9. The solid-state imaging device according to claim 1, comprising:
- a plurality of pixels; and
- a plurality of pixel common circuits each provided for a different set of two or more pixels of the plurality of pixels,
- wherein the plurality of pixels each include the photoelectric conversion unit and the transfer transistor connected to the photoelectric conversion unit, and
- the plurality of pixel common circuits each include the accumulation unit, the amplification transistor, and the reset transistor which are connected to two or more of the transfer transistors belonging to corresponding two or more pixels.

10. A switching circuit comprising:
- first capacitor and second capacitor;
- a transfer transistor connected between the first capacitor and the second capacitor;
- an amplification transistor for amplifying charges accumulated in the second capacitor to generate a voltage signal, the amplification transistor having a gate connected to the second capacitor;
- a third capacitor connected to the gate of the amplification transistor;
- an amplification circuit, disposed in a feedback loop coupling the amplification circuit and the gate of the amplification transistor through the third capacitor, for positively feeding back the voltage signal generated by the amplification transistor to the gate of the amplification transistor through the feedback loop; and
- a switch for causing the feedback loop to become conductive or non-conductive.

* * * * *